(12) United States Patent
Norcross et al.

(10) Patent No.: US 6,327,791 B1
(45) Date of Patent: Dec. 11, 2001

(54) CHAIN CODE POSITION DETECTOR

(75) Inventors: Richard J. Norcross, Darnestown, MD (US); David P. Engvall, St. Joseph, MO (US); W. Robert Bunch, Ashburn, VA (US)

(73) Assignees: The Government of the United States as represented by the Secretary of Commerce; National Institute of Standards and Technology, both of Washington, DC (US)

( * ) Notice: Subject to any disclaimer, the term of this patent is extended or adjusted under 35 U.S.C. 154(b) by 0 days.

(21) Appl. No.: 09/590,895

(22) Filed: Jun. 9, 2000

Related U.S. Application Data
(60) Provisional application No. 60/139,447, filed on Jun. 16, 1999, and provisional application No. 60/138,244, filed on Jun. 9, 1999.

(51) Int. Cl.[7] ................................................ G01B 11/02
(52) U.S. Cl. ................................................ 33/706; 33/710
(58) Field of Search ......................... 33/706, 707, 703, 33/705, 710, DIG. 3

(56) References Cited

U.S. PATENT DOCUMENTS

| | | |
|---|---|---|
| 2,797,614 | 7/1957 | Heidenhain . |
| 3,702,471 | 11/1972 | Kennedy et al. . |
| 4,461,083 * | 7/1984 | Ernst ........................................ 33/707 |
| 4,465,373 | 8/1984 | Tamaki et al. . |
| 4,560,870 | 12/1985 | Ramamurti . |
| 4,602,436 | 7/1986 | Ernst . |
| 4,603,480 | 8/1986 | Sakagami . |
| 4,628,201 | 12/1986 | Schmitt . |
| 4,628,298 | 12/1986 | Hafle et al. . |
| 4,631,519 | 12/1986 | Johnston . |
| 4,720,699 | 1/1988 | Smith . |
| 4,778,273 | 10/1988 | Michel ................................... 33/707 |
| 4,786,891 | 11/1988 | Ueda et al. . |
| 4,799,798 | 1/1989 | Erb . |
| 4,879,555 | 11/1989 | Ichikawa et al. . |
| 4,901,073 | 2/1990 | Kibrick . |
| 4,933,673 | 6/1990 | Ishizuka et al. . |
| 4,947,166 | 8/1990 | Wingate et al. . |
| 4,951,048 | 8/1990 | Ichikawa et al. . |
| 5,023,434 | 6/1991 | Lanfer et al. . |
| 5,171,983 | 12/1992 | Roberts et al. . |
| 5,239,297 | 8/1993 | Kley . |
| 5,251,012 | 10/1993 | Riegger et al. . |
| 5,260,769 * | 11/1993 | Ieki et al. ............................... 33/707 |
| 5,404,226 * | 4/1995 | Kellner .................................. 33/707 |
| 5,511,321 | 4/1996 | Nelle . |
| 5,539,993 | 7/1996 | Kilpinen et al. ....................... 33/706 |
| 5,553,390 | 9/1996 | Ernst et al. ............................ 33/706 |
| 5,574,445 | 11/1996 | Maresca et al. . |
| 5,598,268 | 1/1997 | Kellner . |
| 5,640,008 | 6/1997 | Bosch et al. . |

(List continued on next page.)

OTHER PUBLICATIONS

PCT/US00/16370, International Search Report Sep. 19, 2000.

*Primary Examiner*—Christopher W. Fulton
(74) *Attorney, Agent, or Firm*—Senniger, Powers, Leavitt & Roedel

(57) ABSTRACT

A position detector for sensing the position of a movable member which moves along an axis relative to a stationary member. A nonrepeating N bit chain code embodied in a scale on the movable member runs along the axis. A detector fixed to the stationary member is positioned to sense a portion of the chain code. The detector has K elements ($K \gg N$) generating a plurality of signals. A controller determines the position of the movable member relative to the stationary member as a function of the signals.

35 Claims, 11 Drawing Sheets

U.S. PATENT DOCUMENTS

| | | |
|---|---|---|
| 5,651,187 * | 7/1997 | Affa ........................................ 33/706 |
| 5,678,319 | 10/1997 | Huber . |
| 5,687,489 | 11/1997 | Tondorf et al. . |
| 5,711,084 | 1/1998 | Spanner et al. . |
| 5,754,568 | 5/1998 | Braasch . |
| 5,880,683 | 3/1999 | Brandestini . |
| 5,880,882 | 3/1999 | Michel et al. . |
| 5,889,280 | 3/1999 | Matsuura . |
| 6,018,881 | 2/2000 | Spies . |
| 6,029,118 * | 2/2000 | Strasser ................................. 33/706 |
| 6,099,235 * | 8/2000 | Cain et al. ............................. 33/710 |
| 6,163,970 | 12/2000 | Nelle et al. . |

* cited by examiner

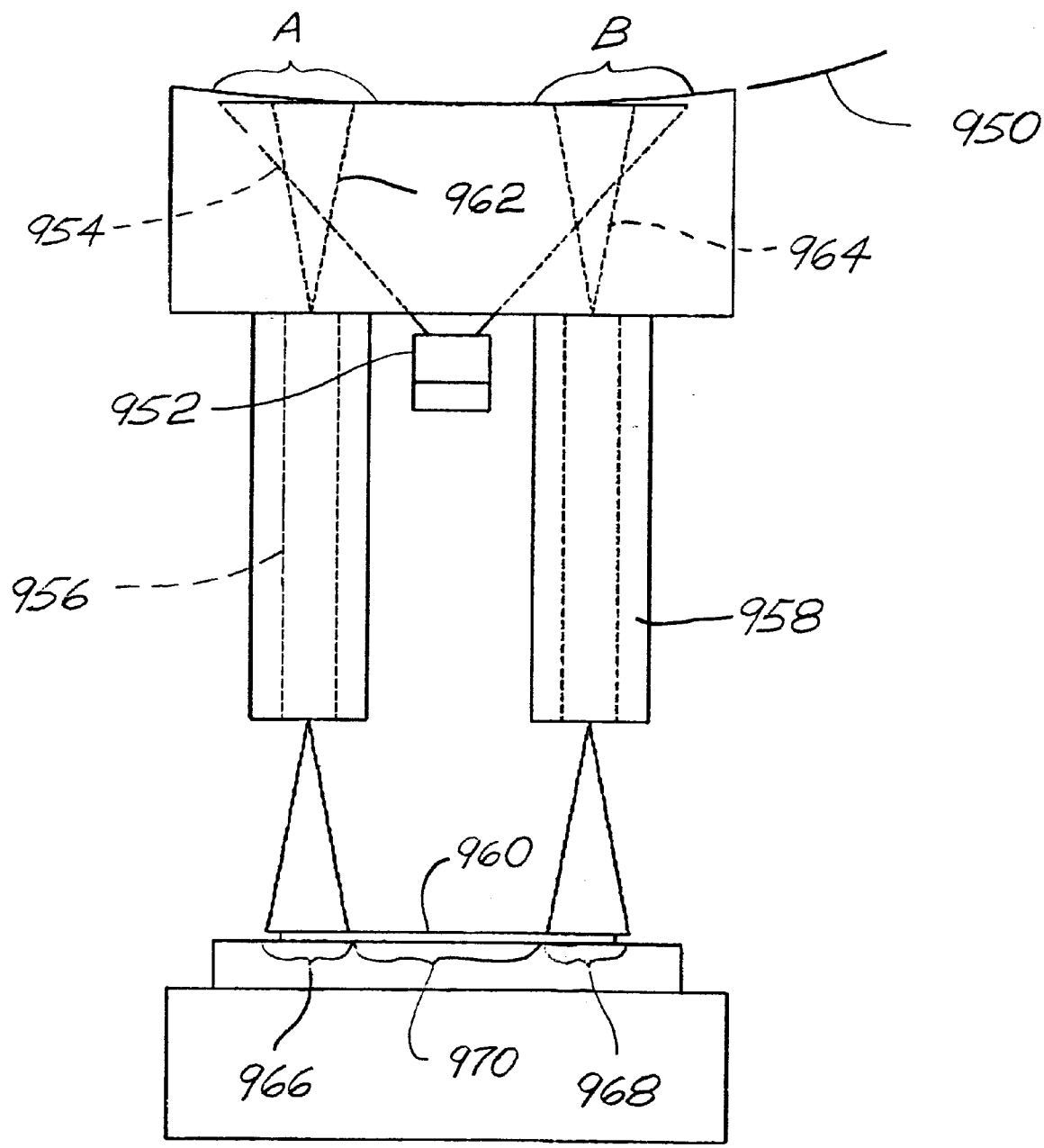

CHAIN CODE POSITION DETECTOR

This application claims benefit of Provisional No. 60/139,447 filed Jun. 16, 1999 and also claims benefit of Ser. No. 60/138,244 filed Jun. 9, 1999.

BACKGROUND OF THE INVENTION

1. Field of the Invention

The invention generally relates to an apparatus for measuring the position of a moving member relative to a stationary member and, in particular, a scale on a rod of a linear motion cylinder (having a rod, housing, gland and driving element such as a piston or rotor) and a detector on the cylinder housing for detecting the scale to indicate the position of the rod relative to the housing, thus detecting the length of the cylinder.

2. Description of the Prior Art

Computerized motion control of actuated cylinders requires rod position and velocity measurements. These measurements must be accurate, repeatable and have sufficient resolution for the particular application. Many applications also require the measurement to be cost effective, easily redundant, immune to mechanical noise and insensitive to debris. The problems with measuring the position of a rod of a linear motion cylinder are particularly acute. Current hydraulic cylinder measurement practice uses either string encoders with multi-turn potentiometers, linear potentiometers or magnetostrictive devices. All of these approaches can be problematic for commodity applications. Magneto-strictive devices are expensive and require either hollow rods or extensive external mountings. On the other hand, string encoders are less expensive but are frail, are subject to animal damage, and are degraded by mechanical noise. Linear potentiometers are length limited and subject to mechanical noise.

SUMMARY OF THE INVENTION

The apparatus of the invention has several advantages over the prior art including instant position detection, increased resolution, inherent redundancy, low maintenance, and vibration tolerance. The apparatus of the invention addresses many of the hydraulic cylinder position measurement problems-to provide an excellent solution in that area as well as in any area where position detection is required. Furthermore, according to the invention, the general approach can be applied to other position measuring problems where one element moves along another.

The invention measures the position of the cylinder rod by observing a scale having sequences of coded marks on the cylinder rod. The cylinder rod presents a rigid base for scales and is thus resistant to mechanical vibration. The scales are inexpensively applied to the cylinder rod through such techniques as photo engraving or laser marking. Preferably, the detector for detecting the sequences of coded marks comprises an array of detectors such as an electronic camera. The detector preferably takes multiple readings of the sequence so that the resultant information is resistant to sporadic errors. From a manufacturing standpoint, the detectors are structured to be replicated on a consistent basis to enhance system reliability.

Preferably the invention employs a stationary detector on the cylinder housing and a scale (preferably illuminated) having a code marked on the cylinder rod which code does not repeat itself within a desired range. For example, the scale may use a chain code to provide an absolute position while viewing a minimum length of the scale. The detector uses the two-dimensional array of detector elements to detect the image of the scale. A lens or other focusing device may be used to transfer the image to the detector. The multiple detector elements provide multiple signals which, when evaluated, provide redundancy, error tolerance and improved resolution.

In one form, the invention comprises a device for sensing the position and velocity of a movable member which moves along an axis relative to a stationary member. A scale encompassing a nonrepeating code is on the movable member aligned substantially along the axis of movement. A detector is fixed to the stationary member and positioned to sense a portion of the scale. The detector generates a plurality of signals, each signal indicative of the portion of the scale sensed by the detector. A controller determines the position of the movable member relative to the stationary member as a function of the signals.

Other objects and features will be in part apparent and in part pointed out hereinafter.

BRIEF DESCRIPTION OF THE DRAWINGS

FIG. 11 illustrates a partial side view of a cylinder position detector with self focusing lens arrays.

Figure 6:
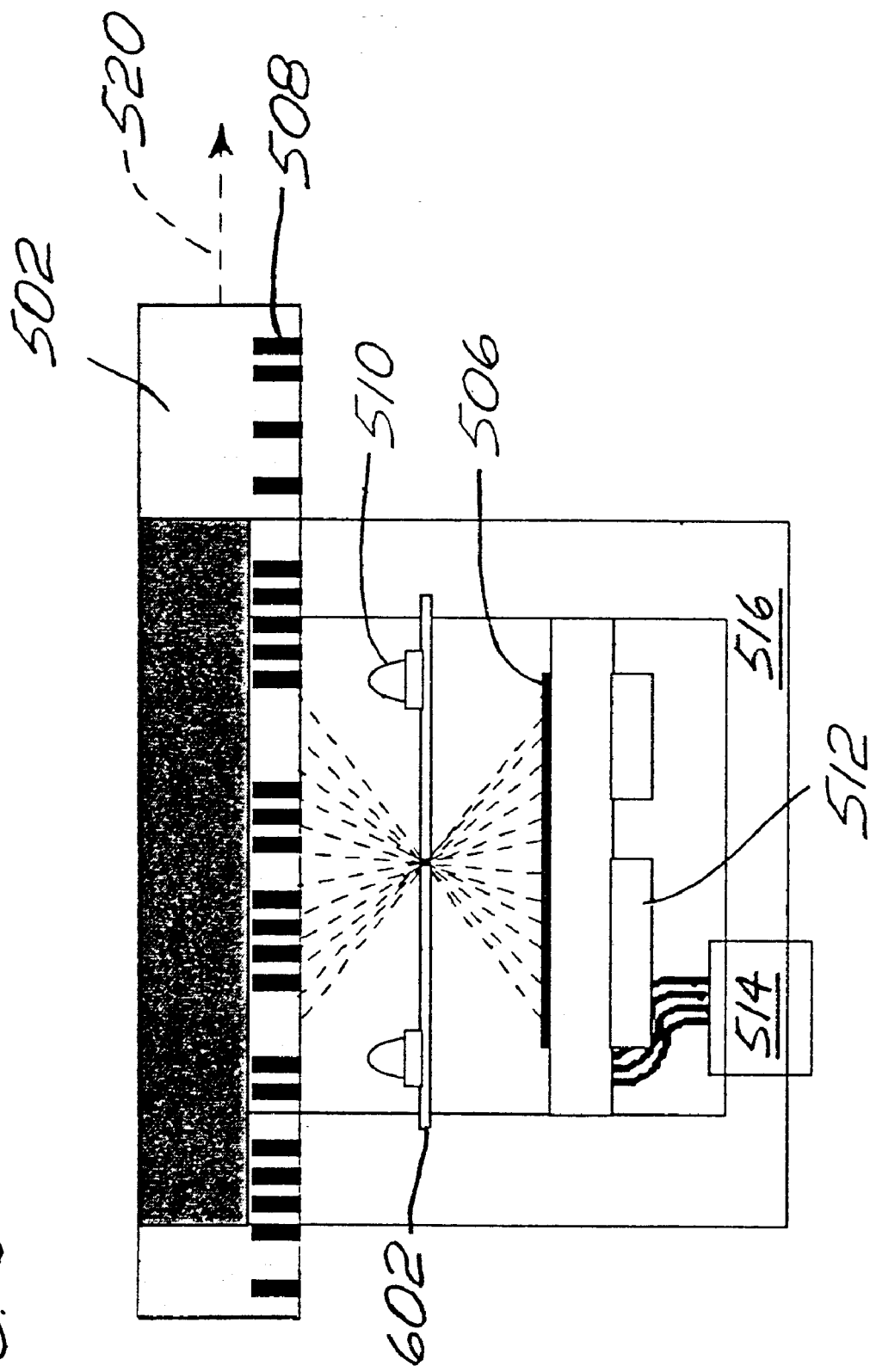
FIG. 6 is a schematic illustration of one preferred embodiment according to the invention of a detector having a pin hole lens.
Figure 8A:
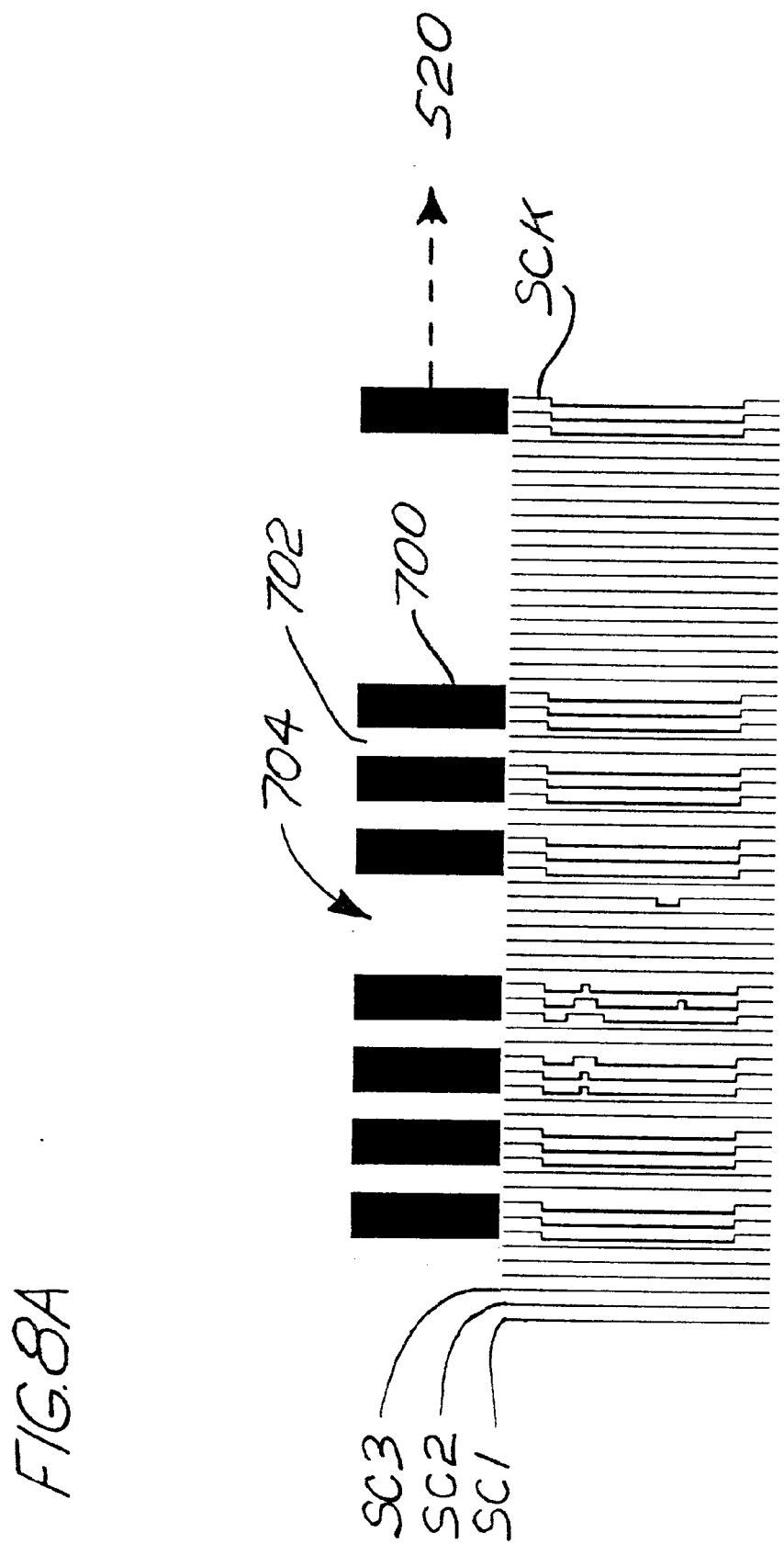
FIG. 8A is a waveform diagram of one preferred embodiment according to the invention wherein the scale marks are perpendicular to the axis of movement and the detector is read along the length of the scale marks perpendicular to the axis of movement.

The Appendix describes one preferred embodiment of the invention for processing signals according to the invention of FIGS. 6 and 8A.

Corresponding reference characters indicate corresponding parts throughout the drawings.

DETAILED DESCRIPTION OF PREFERRED EMBODIMENTS

Figure 1:
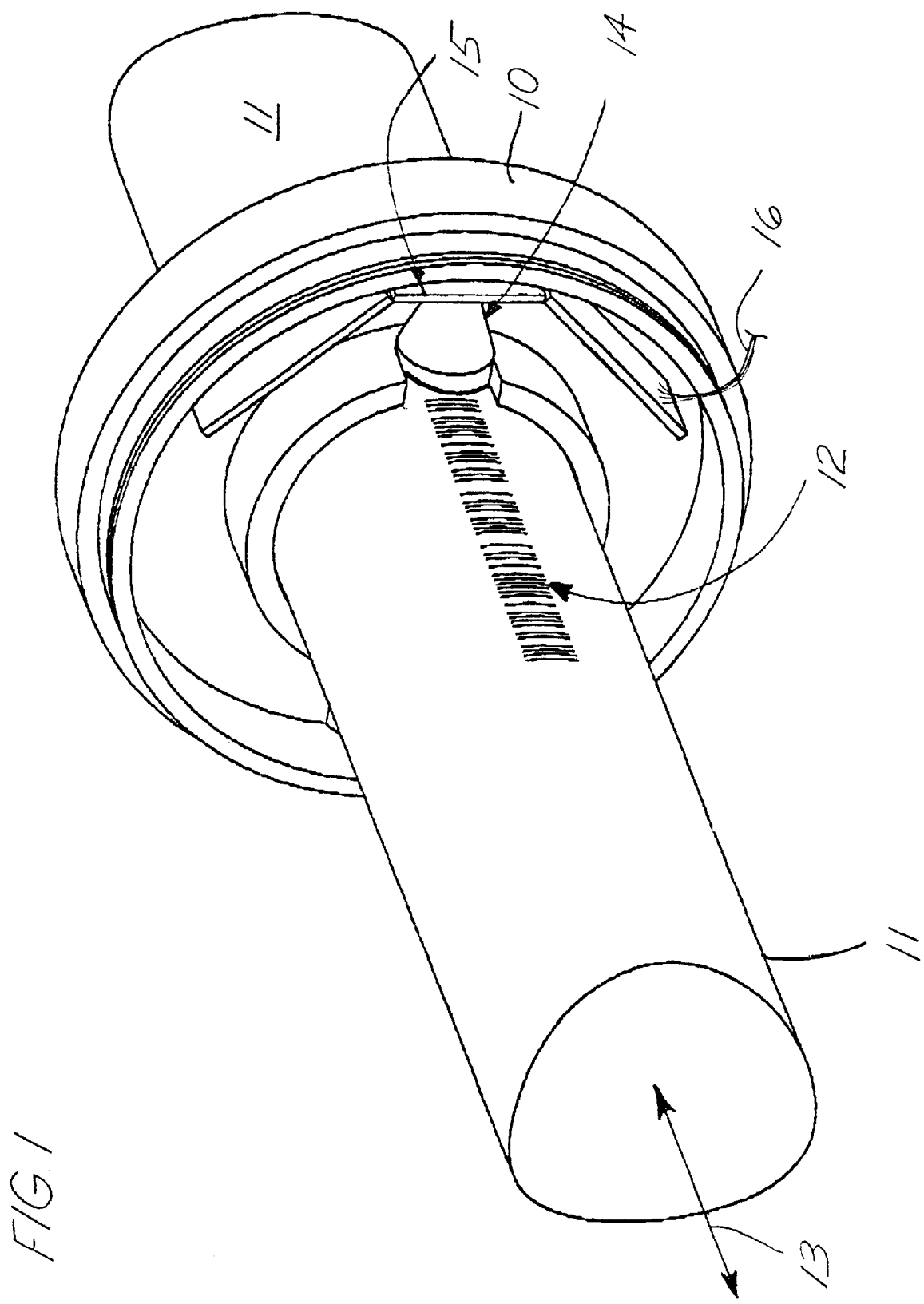
FIG. 1 is a side perspective view of a cylinder housing having a detector thereon and a cylinder rod having a scale thereon according to the invention.

Referring to FIG. 1, a partial schematic perspective view of one preferred embodiment of a linear motion cylinder (hydraulic, pneumatic or electrical) according to the invention for use as a position sensor is illustrated. A cylinder gland nut 10 guides a rod 11 with a scale 12 thereon consisting of a pseudo-random series of bits known as a chain code. The scale 12 is aligned with the axial motion 13 of the rod 11. A detector 14 is mounted in the gland nut of the cylinder over a portion of the scale 12 on a circuit board 15. The detector 14 generates a signal which indicates the position of the rod from the observed portion of the scale 12 and the circuit board 15 periodically communicates the position data along a communications medium (e.g., wires) 16. Although the axial motion is shown as linear, it is contemplated that the motion may be non-linear so that the axis of motion may not be a straight line. For example, the axis of motion may be circular.

Figure 1A:
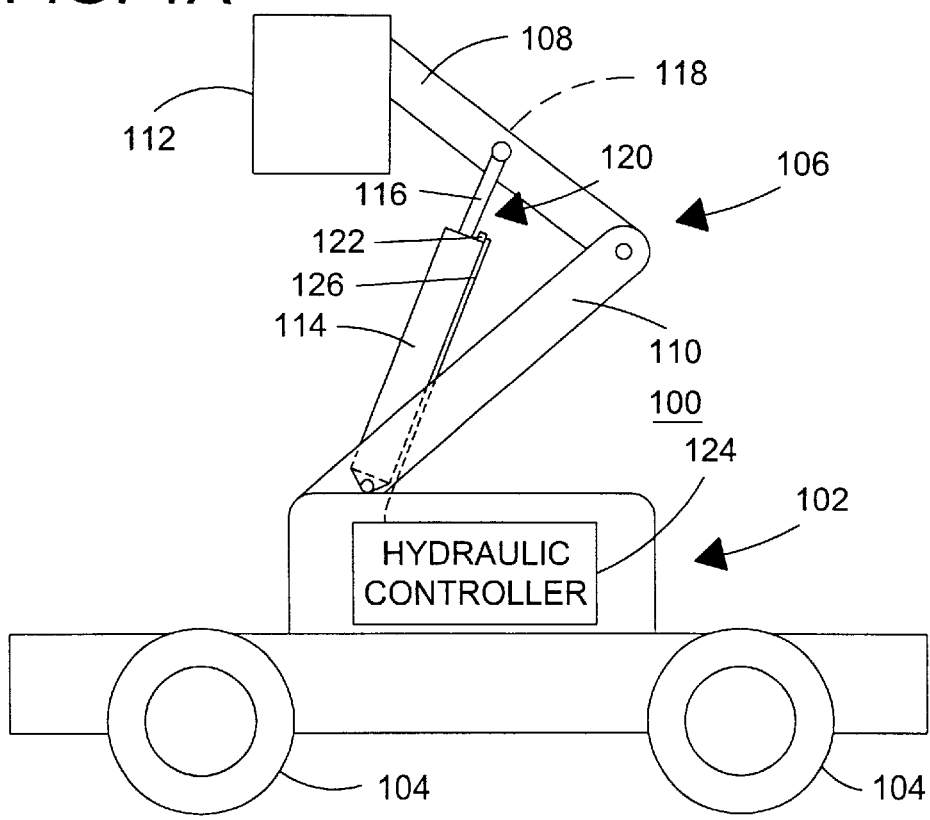
FIG. 1A is a schematic side view of one preferred embodiment of an aerial work platform machine according to the invention.

Referring to FIG. 1A, a schematic side view of one preferred embodiment of machine such as an aerial work platform 100 according to the invention is illustrated. Although the invention is not limited to aerial work platforms, articulated booms and the like, FIG. 1A shows such a machine for the purposes of illustration only. Those skilled in the art will recognize that the invention may be used in many different applications where position or time based derivatives or other position related parameters need to be monitored or sensed.

The machine illustrated in schematic form in FIG. 1A includes a base 102 supported by a plurality of wheels 104. An extendable boom 106 is supported by the base 102 and has a movable section 108 which is movable relative to a reference section 110. The moveable section 108 is adapted to support a work platform 112. A cylinder 114 drives a movable section such as a cylinder rod 116 along an axis 118. As illustrated in FIG. 1A, the cylinder 114 is hinged to the reference section 110 whereas the cylinder rod 116 is hinged to the movable section 108. However, it is also contemplated that the cylinder 114 may be hinged to the movable section 108 and that the cylinder rod 116 may be hinged to the reference section 110. In either case, as the cylinder 114 drives the cylinder rod 116 to extend or retract the cylinder rod along axis 118, the movable section 108 of the boom is rotated about the hinge pin which connects it to the reference section 110. In other words, movement of the cylinder rod 116 along the axis 118 which movement by the cylinder rod is relative to the cylinder 114 causes rotational movement of the movable section 118 relative to the reference section 110. A scale 120 is engraved, etched or marked on to the cylinder rod 116 and runs along the axis of the cylinder rod which is coincident with axis 118. The portion of the scale that appears on the cylinder rod 116 has a nonrepeating code although the code in general may have a repetition rate which is greater than the length of the amount of scale that appears on the cylinder rod 116.

A two-dimensional detector 122 is affixed to the cylinder 114 so that it is stationary relative to the cylinder rod 116. The detector 122 is positioned to sense a portion of the scale 120 on the cylinder rod 116. The detector is connected to a hydraulic controller 124 which controls the operation of the cylinder 114. In particular, the detector 122 is connected by a wire harness 126 to the controller 124. The detector 122 generates a plurality of signals, each signal indicative of the portion of the scale being sensed by the detector. As a result, the controller determines the position of the cylinder rod 116 relative to the cylinder 114 as a function of the signals provided to it by the detector 122.

Figure 2:
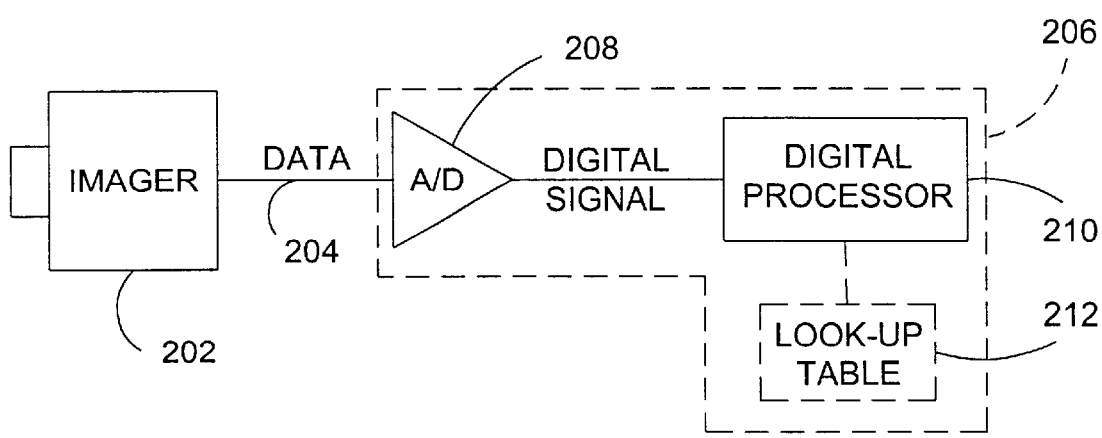
FIG. 2 is a block diagram of one preferred embodiment according to the invention of an imager and related components for processing a data signal provided by the imager.

FIG. 2 is a block diagram of one preferred embodiment according to the invention of the components of a controller for processing the signal provided by detector 122 shown in FIG. 1. In particular, FIG. 2 relates to the embodiment wherein the detector is an image detector such as a CCD or CMOS camera 202 providing a data signal via the harness 204 which connects the detector 202 to a controller 206. The controller 206 includes an analog to digital (A/D) converter 208 for converting the analog data signal provided via harness 204 into a digital signal supplied to a digital processor 210 for processing. As will be described below, the processor 210 may refer to a look up table 212 to assist in the analysis and recognition of the portion of the code being sensed. In one form, the scale according to the invention is a pseudo-random collection of marks and spaces commonly known as a chain code. For the hydraulic cylinder application, the scale is applied to the cylinder rod through a photo absorption process. The imager 202 constitutes a detector array providing a two-dimensional package of detector elements and can be implemented by an electronic camera. In general, the scale is a physical representation of the code. The code is represented by a series of marks and spaces (with gaps therebetween). In one preferred embodiment, the marks and spaces have 25 mils center-to-center spacing with each mark and space being about 18 mils wide and each gap between the marks being about 7 mils wide. In the processor 210, the code is represented by a binary number. The portion of the scale being read is an area on the cylinder rod while the portion of the code is a number sequence.

The marks and spaces on the cylinder rod form the chain code. In general, an N-bit chain code is a pseudo-random sequence of bits arranged such that any N-bit sub-sequence is unique within the total sequence which appears on the cylinder rod 116. Although the chain code itself may be repeating, the repetition period is greater in length than the portion of code of interest on the cylinder rod 116. Since each portion of the scale is unique and non-repeatable as it appears on the cylinder rod 116, once the end bit of each subsequence of the portion of the scale being detected is identified, the absolute position of the cylinder rod relative to the cylinder can be determined such as by a look up table or by the product of the mark spacing and the position of the sub-sequence in the whole sequence.

Figure 3:
FIG. 3 illustrates one preferred embodiment according to the invention of a scale having an 8-bit chain code.

The chain code may be any size. For example, the sequence "10" is a one bit chain code sequence. Similarly, "00110" is a two bit chain code. The scale illustrated in FIG. 3 is an 8 bit code with the left most value being 10000101 (133) and the next value adjacent to it being 00001011 (11). The number of bits in a chain code can be any number up to $2^N+N-1$ yielding up to $2^N$ unique N-bit subsequences. A chain code covers a distance up to the product of the bit spacing and the number of bits. In general, a 24 bit code constitutes one preferred embodiment.

The chain code provides a minimum number of marks in every N bit sequence. For example, a simple computer program can build the scale by computing the value by left shifting the previous value and checking a flag that indicates whether the value is in use. If the value is already in use, the program changes the first bit and checks the new value. If that value is also in use, the program backtracks in the scale until the bit change generates an unused value. A flag for the new value is set and the cycle repeats. To ensure that the values have a minimum number of marks (M), the flags of the values with fewer than M "1" bits may be preset. A minimum number of spaces can also be ensured in a similar fashion. Those skilled in the art will recognize that other algorithms may be used to generate such codes. One advantage of the chain code is that it minimizes the number of bits that must be observed to determine a unique position.

Figure 4:
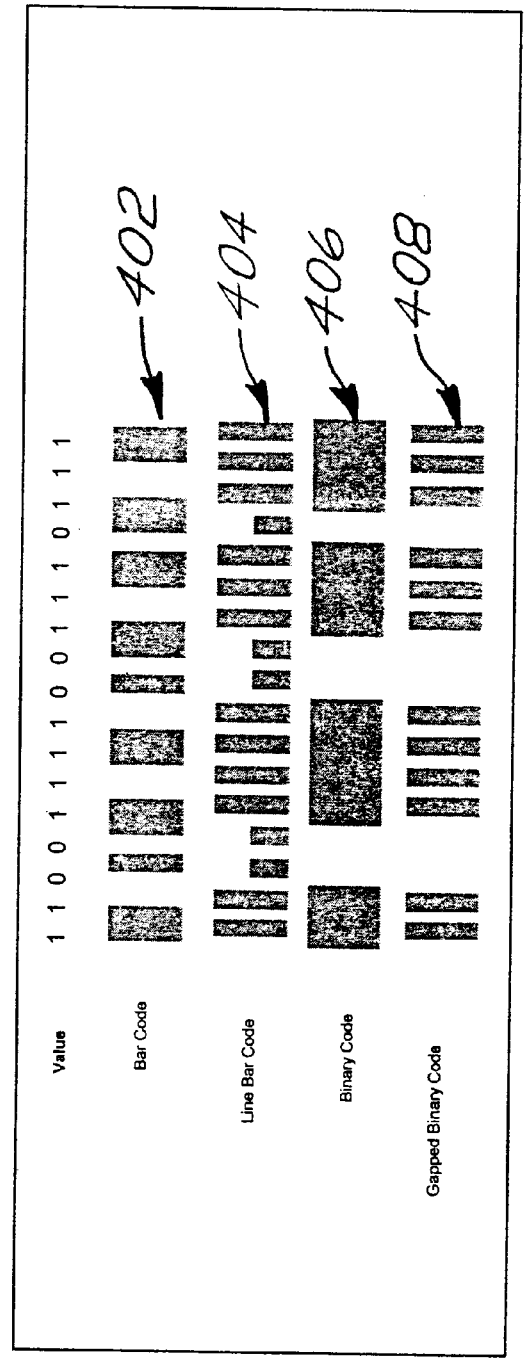
FIG. 4 illustrates other preferred embodiments of scale codes according to the invention.

It is also contemplated that numerous methods and representations of the code of the scale may be used, some of which are illustrated as exemplary in FIG. 4. As illustrated in FIG. 4, the representations include a bar code 402, a line bar code 404, a solid binary bar code 406 and a gapped binary code 408. In general, the bar code 402 uses alternating light and dark areas having a thickness which determines the indicated value (generally thicker for a 1 and thinner for a 0). The line bar code 404 uses a sequence of evenly spaced long and short lines wherein the long line represents a "1" while the short line represents "0." The solid binary bar code 406 uses marks that are as wide as the bit spacing. In certain applications, a gapped binary code 408 may be preferred because the mark width is less than the bit width. In general, other preferred embodiments include a scale comprising evenly spaced bits of marks or spaces on the movable cylinder rod and where the mark width is less than the bit spacing; or evenly spaced marks wherein the length of the mark defines its bit value; or unevenly spaced bits of marks or spaces on the movable cylinder rod wherein the width of the mark or the width of the space defines its bit value.

Figure 5:
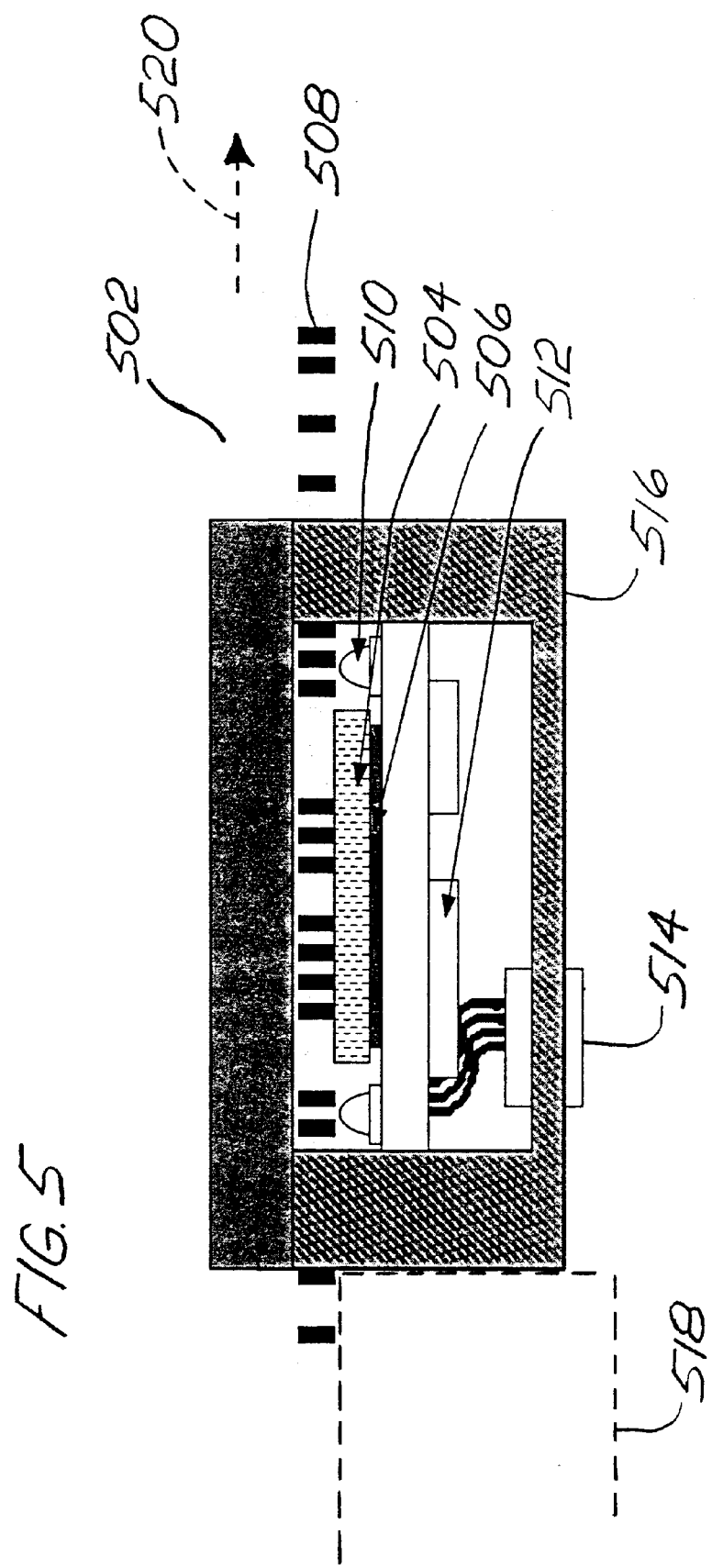
FIG. 5 is a schematic illustration of one preferred embodiment according to the invention of a zero clearance detector.

FIG. 5 illustrates one preferred embodiment of an apparatus according to the invention referred to as a zero clearance detector employed to detect the position of a cylinder rod 502 driven by a hydraulic cylinder 518 (see also reference character 114 in FIG. 1). Many times, such cylinder rods 502 are chrome plated so that chrome forms a hard, porous surface that absorbs minute amounts of oil while inside the hydraulic cylinder. When passing to the outside of a cylinder, the pressure on the chrome falls and the absorbed oil flows out of the chrome and lubricates the seal between the gland and the rod. One advantage of the scales according to the invention is that such scales provide spaces and provide gaps between the marks. These spaces and gaps present chrome which is available to lubricate the seal.

It is contemplated that any detector or sensor may be used to read the scale on cylinder rod 502. For example, a contact detector may be used in which case the scale is read directly by contact so that an image of the scale is not transferred to the detector and the image does not need to be focused. When the detector comprises an optical detector such as a CCD or CMOS detector, it is preferable to transfer an image of the scale on the detector to enhance the accuracy of the apparatus according to the invention. The detector may also be other sensing devices such as a CMOS optical detector.

As illustrated in FIG. 5, one preferred focusing device may be a block of densely packed and commonly aligned optical fibers known as an optical conduit 504. The optical conduit 504 is interposed between the cylinder rod 502 and a detector 506 to eliminate the gap therebetween. The optical conduit 504 rides on the surface of the cylinder rod 502, either within or immediately above the oil film. Since condensation, dust and oil vapors have the potential to collect in the gap and interfere with the viewing of the scale by the detector 506, gap elimination improves the reliability of the invention.

In order to enhance the ability of the detector 506 to read a scale 508 on the cylinder rod 502, it is contemplated that an illumination source 510 may be positioned within the gap around the periphery of the optical conduit 504. For example, LEDs may be positioned on either end or around the periphery of the optical conduit to emit light which is transmitted by the optical conduit 504, reflected by the scale 508 and detected by the detector 506. The detector 506 generates signals which are provided to electronics 512 which signals are then transmitted to a controller via a communications connector 514 such as an IEEE transducer independent interface or bus. A detector housing 516 is supported and fixed on the cylinder 518 so that it is fixed relative to the housing of the cylinder and the rod 502 moves relative to the housing along the axis 520. The housing 516 supports the detector 506 and optical conduit 504 as well as the illumination source 510. The electronics 512 are enclosed within the housing 516. The communications connector 514 is connected to the controller via a harness (not shown in FIG. 5; see FIG. 1, reference character 126).

Other optical techniques may be used to focus an image of the scale 508 on the detector 506. For example, in place of the optical conduit 504, a pin hole lens 602 may be positioned between the cylinder rod 502 and the detector 506 as shown in FIG. 6. While such pin hole lenses may tend to be less expensive than the optical conduit 504, such pin hole lenses may require additional illumination as compared to the illumination required by an optical conduit 504. Pin hole lens applications may be particularly useful in relatively clean environments. Another optical focusing technique which is contemplated includes the use of a conventional optic lens (not shown) positioned between the cylinder rod 502 and detector 506 in place of pin hole lens 602. While a conventional optical lens may actually require less illumination to transform the image than the illumination required by an optical conduit 504, the lens itself must be selected to provide an undistorted image at such a short standoff. In addition, some lens may be spaced from both the surface of the cylinder rod 506 which carries the code 508 and the surface of the detector 506 thereby defining cavities that can become contaminated.

Figure 7:
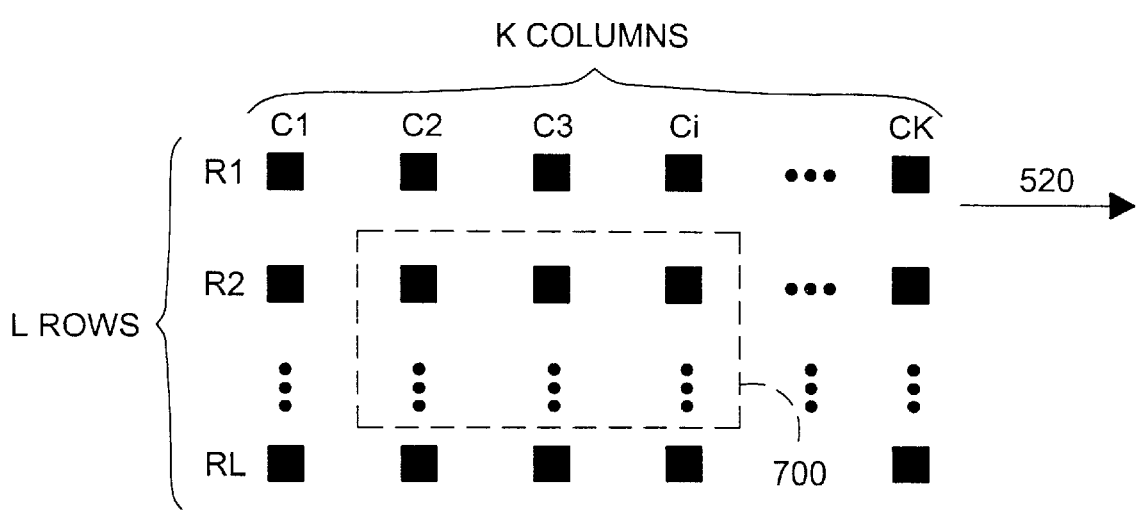
FIG. 7 is a plan view of the front of the detector illustrating the pixel arrangement.

Preferably, the detectors 506 according to the invention include high density detector arrays as shown in FIG. 7 having a dimension of at least K×L elements. The detector has K columns C1–CK of elements defining its width (horizontally, along the axis 520) where K is much greater than the N bits of the code mark 700 preferably by an order of about 5 or more. The detector also has and L rows R1–RL of elements defining its length (vertically, perpendicular to the axis 500) where L is equal to or greater than one. The detector array is sized and positioned to simultaneously detect N+1 or more bits. The image is processed by the electronics 512 (FIG. 5) and the final values are presented on a communications medium (e.g., CAN, RS-232, 4–20 mA).

Figure 8B:
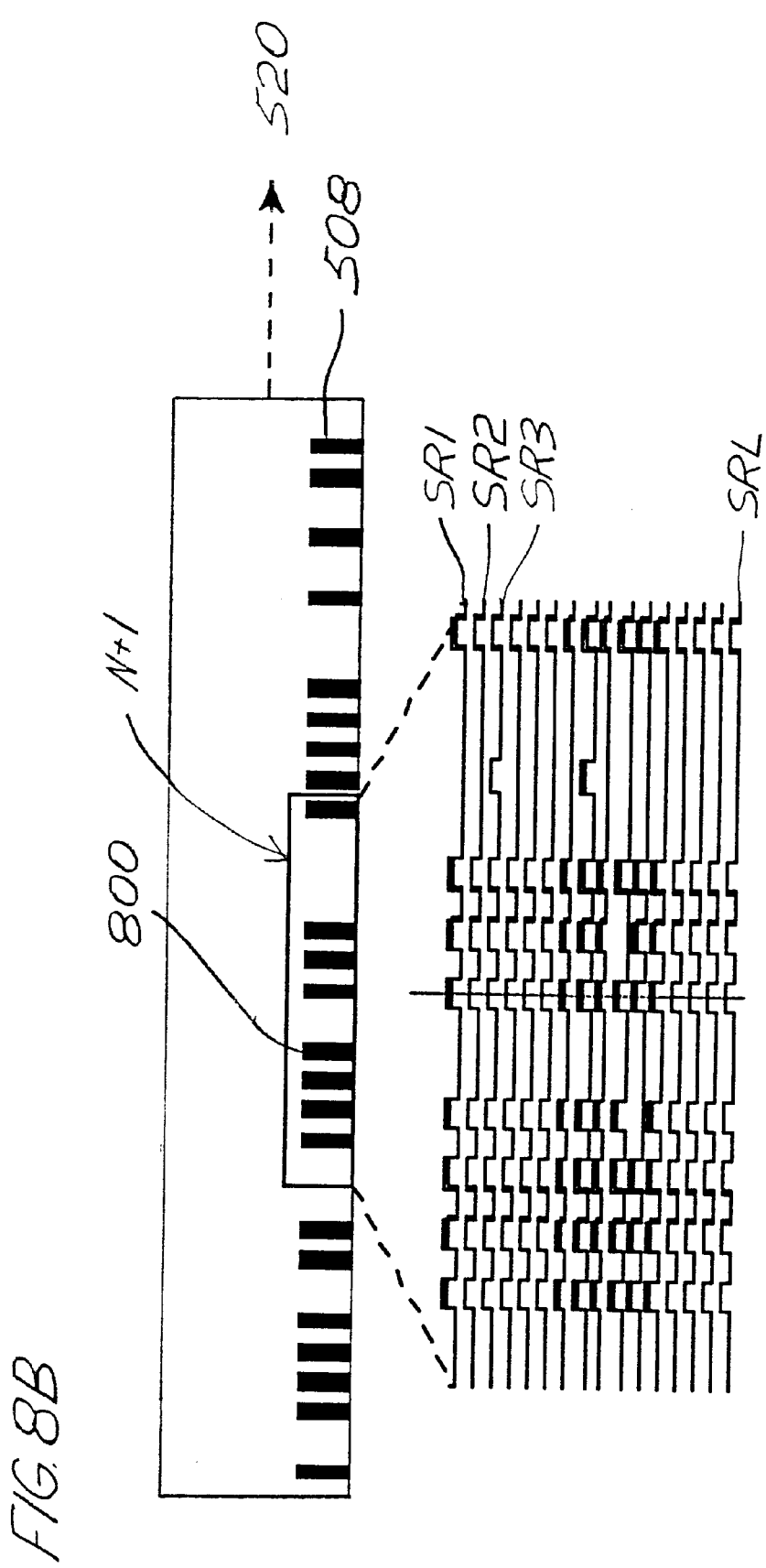
FIG. 8B is a waveform diagram of one preferred embodiment according to the invention wherein the scale marks are perpendicular to the axis of movement and the detector is read along the direction of the axis of movement.
Figure 9:
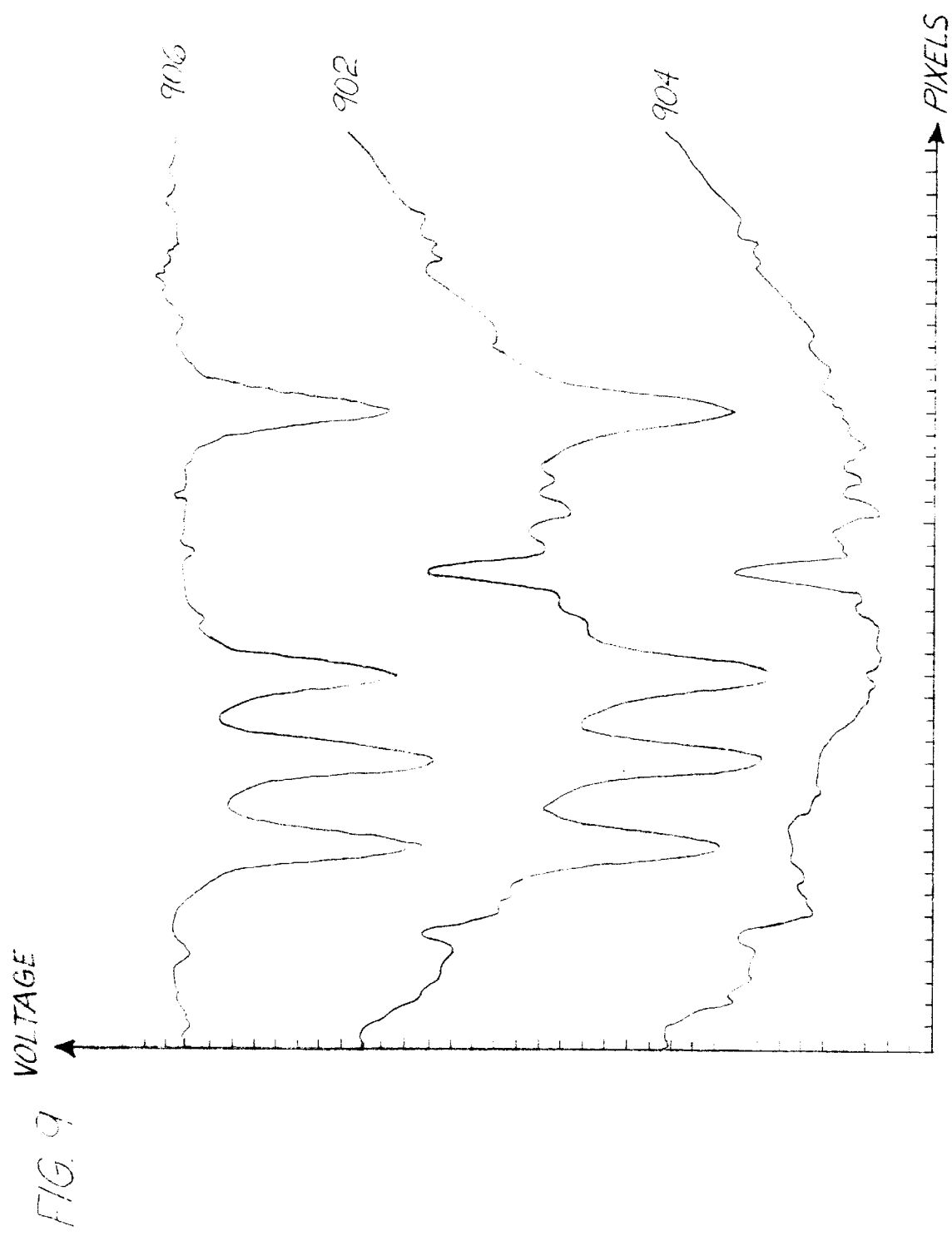
FIG. 9 illustrates various waveforms relating to the detector output of one row of detectors.

The detector 506 may read the scale along the length of each of the marks of the code (vertically as shown in FIG. 8A) or along the width of the marks and along the travel axis 520 (horizontally as shown in FIG. 8B). FIG. 8A illustrates the waveforms that would be generated by reading the scale along the length of the marks. This type of reading allows K signals to be easily integrated. Such K integration, performed by the digital processor 210, filters out most noise and leaves K values to be interpreted. The Appendix describes one preferred embodiment for processing such signals. FIG. 9 illustrates one such waveform analog data signal 906 from imager 202, which is generated by taking the analog output 902 from a CMOS imager viewing the scale and subtracting background noise 904.

As shown in FIG. 8A, the code 508 preferably comprises a chain code having marks 700. Each mark has a length oriented substantially perpendicular to the axis 520 although marks having other orientation such as diagonal marks are contemplated. The imager 202 constitutes an array forming L rows of elements (pixels) along the length L of each mark and forming K columns of elements along a width of the marks. The elements are read vertically. The elements in the first column are read successively to produce a signal SC1. The elements of adjacent columns read successively to generate a plurality of signals SC2, SC3, . . . , SCK.

The detectors may also read the scale along axis 520 which would be along the width of the marks as shown in FIG. 8B. Each K set of pixels produces a reading of the entire scale. These readings may be compared and combined to remove spurious noise.

As shown in FIG. 8B, the code 508 preferably comprises an N-bit chain code having marks 800. Each mark has a length oriented substantially perpendicular to the axis 520. The imager 202 constitutes an array forming L rows of elements (pixels) along the length of each mark and forming K columns of elements observing N+ bits of the scale. The elements are read horizontally. The elements in the first row are read successively to produce a signal SR1. The elements of adjacent rows read successively to generate a plurality of signals SR2, SR3, . . . , SRL. FIG. 8B shows a window of N+1 bits for detecting an N-bit code.

Figure 10:
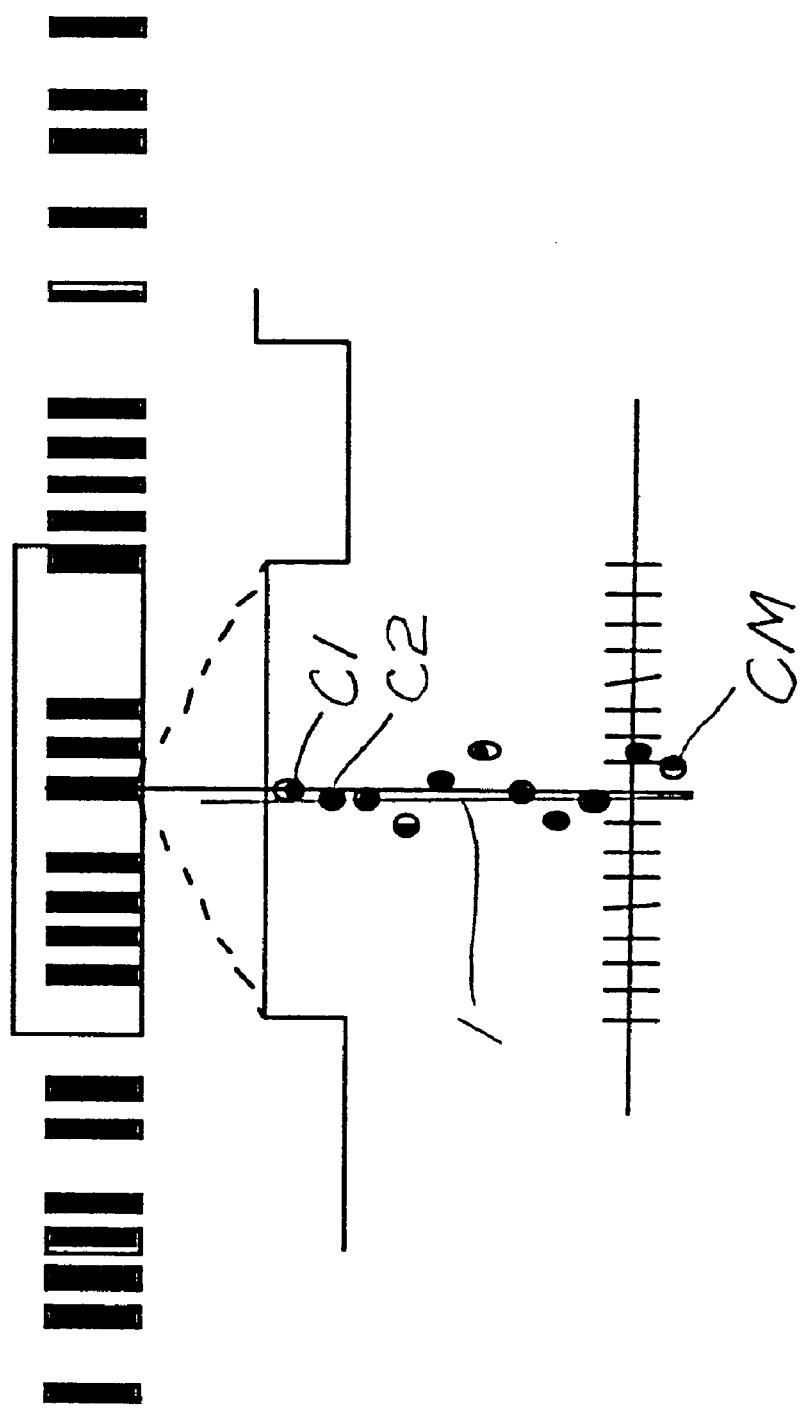
FIG. 10 is an illustration of interpolation according to one preferred embodiment of the invention.

It is contemplated that the detector resolution may in fact be finer than the size of the pixel. For example, after the center of given mark is computed for each one dimensional read, the centers C1–CL are interpolated across the middle of the detector as illustrated in FIG. 10. The intersection I of the interpolation in the detector middle is the actual position of the scale relative to the detector.

The detector data is interpreted to provide the bit subsequence of the code that is under the detector and the position of the center of one or more marks. The mark centers provide a position resolution in excess of the resolution of the scale. The higher resolution allows small changes in position to be used to compute the motion velocity from sequential sensor readings.

FIG. 11 illustrates a cylinder position detector with self focusing lens arrays according to the invention. In this preferred embodiment, two scales A and B on the cylinder rod 950 are illuminated by a light source 952 projecting light at an illumination angle 954 sufficient to illuminate both scales A and B. Two self focusing lens arrays 956, 958 are positioned between scales A and B and an imaging array 960, respectively. The arrays have a view angle 962, 964 for sensing the scales and project the sensed images 966, 968 of scales A and B onto the imaging array 960. A portion 970 of the imaging array 960 is unused. In this embodiment, the code comprises a group of two or more repeating codes, each code represented by one of the scales A or B. The code of scale A has a different number of bits than the code of scale B, where the number of bits do not have a common denominator. When the codes are aligned with each other along the axis of motion, the combination of N bits from each repeating code does not repeat for the length of the scale.

The discussions above are with regard to position resolution but not with regard to position accuracy. While the resolution of the detector 506 is a function of the type of detector, the sensor's accuracy is a function of the scale. The sensor's accuracy may be improved when a look up table 212 is used for position conversion rather then the offset computation. A look-up table produces independent values for each sub-sequence in the chain code and can be set up to compensate for inaccuracies. The table can also provide information on environmental effects such as temperature. Enhanced resolution and the possibility of enhanced accuracy are two advantages to the invention.

Also, if N marks constitute the portion of the scale being detected, N+1 marks are sensed. Alternatively, N+2 or more marks may be sensed and used to detect two portions of the scale (e.g., 1 to N and 2 to N+1 may be detected) to provide redundancy. In other words, in the device of the invention the portion of the scale being detected equals N+A marks (where A is greater than or equal to one) and the portion of the scale being processed by the controller equals N marks within in the N+A marks being detected so that two or more different sets of N marks within the N+A marks are processed by the controller.

The L rows of pixels may be divided into J groups of rows so that interpretation of J subsets of L/J pixels each can also be used to provide velocity data in high speed applications. Each of the J subsets of L detector elements would be activated at tightly controlled intervals. The position sensed by the later subset detector elements will be offset from the earlier subset detector elements. This offset can be measured and the derivatives of the position calculated.

Absolute position detectors based on serial scales generally require movement prior to the identification of the initial position. Since the invention reads N+A bits of the chain code each cycle, the detector detects the absolute position prior to any motion. Determining the position prior to motion is important in motion control applications where the machine may start away from fixed points.

Industrial environments can deposit dirt and dust on the machine that can obscure parts of the scale. The invention takes a broad view of the scale; thus, while part of a mark or space may not be visible, the detector will have sufficient data to evaluate the condition of the scale and to distinguish the actual position. The controller can also request maintenance when the system resolution degrades below a preset value.

The resolution of an absolute position detector with a serial scale is commonly a function of the scale. Thus, to achieve usable resolutions, very fine scale spacing is required. Since the distance covered by the detector is the product of the spacing and the number of bits in the scale, coverage (the scale's length) may have to be sacrificed to achieve reasonable resolution. In addition, the manufacturing cost of the scale tends to increase as the spacing decreases. In the invention, the resolution is a function of the detector array. Thus, the spacing can be larger allowing for greater detector coverage and lower manufacturing costs then the current absolute position detectors.

In some applications, the scale's coverage may be larger then the ability to manufacture the scale. To achieve the desired coverage, smaller scale segments would be assembled end to end. The joints between the scale segments can be identified by a wider mark, such as a blank area between the scales or a joint mark such as a distinctive line (e.g., a diagonal). The joint mark would be identifiable as not part of the chain code. The portion of the chain code immediately before or after the joint mark would identify the joint, e.g., if a dozen joints were in the scale, four bits would have to be unique on either side of the joint mark to identify the location. Since the invention scans the scale, the invention can detect and identify the joint without additional hardware.

The invention preferably uses gapped scales representing a code. The code is applied to the rod to form a scale of marks and spaces. The marks have a common length and align along the axis of motion 103. The preferred embodiment of the invention uses gapped scales. The gapped scale has a consistent bit spacing and a mark width smaller then the bit spacing that leaves a small amount of unmarked material between successive marks. This characteristic has advantages for the invention in general and the hydraulic cylinder application in particular. The small gap between the marks simplifies their manufacture, ensures the mark widths are constant, and simplifies the computation of the center used for improved resolution. For hydraulic cylinders, the gap leaves unmodified chrome to perform the necessary lubrication of the cylinder gland. The scale would be marked on the hydraulic cylinder rod's chromeplate through laser photo-absorption or similar process. Note that the initial chrome coating must be of high quality to maintain adequate corrosion resistance or a process can be applied after the marking to restore the corrosion resistance.

The gapped scale was developed for environments where the spacing between the scale and the detector could be rigidly controlled. When this control is not feasible, the scale may use a more traditional bar code approach to distinguish the "1" and "0" bits. The bits could be based on mark length, such as used on mail envelopes, or based on thickness, such as used on product labels. The detector would be sized to view either the longer line or N+ wide bits respectively.

As noted above, one application for this invention is to measure the position of a cylinder rod 502 driven by a hydraulic cylinder 518. The scale would be marked on cylinder rod 502 while the detector (e.g., FIGS. 5 and 6) would be mounted near or on the gland. The scales would be marked directly on the cylinder rod's chrome plate through laser photo-absorption. However, virtually any positioning device can benefit from this invention. The scales can be etched on anodized aluminum to be rugged, low cost, and very flexible. Position control of gantry cranes would, in particular, benefit from this invention. Other applications would be to control drawbridges, canal locks, gantry cranes, tower cranes, elevators, conveyors, robotics or computer controlled painters.

High speed applications would include automobile shock absorbers. The invention could provide the position and velocity necessary to monitor road and handling conditions and to allow automatic compensation.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

APPENDIX

0) The Setup
The laboratory model used a miniature, monochrome CCD camera, a pin hole lens, and an acrylic mount.
The camera outputs NTSC (RS-117) video. Although NTSC transmits two interlaced 242 line by 500 pixel frames 30 times per second, only one frame was used in the measurement. The camera was mounted such that the horizontal camera lines were parallel to the chain code marks.
The pin hole lens was a simple 100 micron hole in thin aluminum.
An acrylic mount held the camera, the lens, and up to 16 LED's (Light Emitting Diodes). The mount maintained suitable standoff to view 15+ bits of the chain code. The mount had a cone shaped interior cavity with a light diffusing surface (i.e., the surface was lightly ruffed). 12 LED's were set in the acrylic mount to illuminate the scale under the cone.
NTSC is an analog signal. The signal was heavily filtered through an RC circuit.

APPENDIX-continued

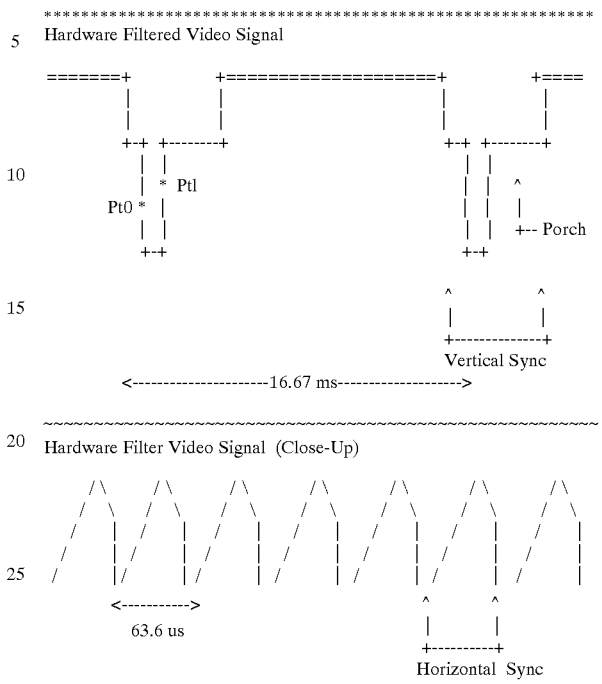

1. Find the porch
   a. Look for a value below Pt0.
   b. Look for a value above Pt1.
   c. Read in values and compute a local minimum in a certain number of data reads. This value becomes the PorchMin value.
   d. Use the current Pt0, Pt1, and PorchMin to pre-compute Pt0 and Pt1 for the next frame.
      Pt0 = (PorchMin + Min)/2
      Pt1 = (3*PorchMin + Min)/4
2. Find the horizontal lines
   a. Look for a local minimum. This value becomes the start of the horizontal line.
   b. Sum the data around the local minimum. This value becomes the value for that horizontal line.
   c. Repeat for 256 lines.
3. Find the initial step from vertical sync to video data
   a. Look for a local maximum in the first so many lines of the data. This should be somewhere in the video data.
   b. Skip a couple lines to make sure we are in a good video area.
4. Filter the data
   Perform a simple filter on the data to smooth it.
      R[i+2] + 2*R[i+1] + 2*R[i] − 2*R[i−1] − R[i−2]
5. Compute the derivative threshold
   a. Find the minimum and maximum value for the individual lines of data.
   b. Compute the threshold.
      Thresh = (Min − Max) * 4/50
      (The coefficients in this equation were determined experimentally.)
6. Compute the derivative and flag the data
   a. Compute the derivative (Der) for each line.
      Der = R[i+3] − R[i]
      (The spacing was determined experimentally.)
   b. If D<−T (D+T<0), then flag the line as a negative line.
   c. If D>T (D+T−2*T>0), then flag the line as a positive line.
7. Simulate the video bars
   Look for a negative line followed later by a positive line.

APPENDIX-continued

Derivative Flag

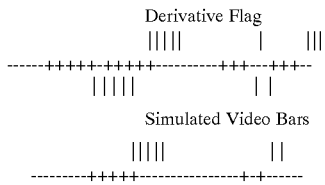

Simulated Video Bars

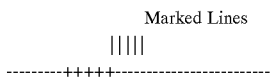

8. Look for at least 3 consecutive marked lines

Marked Lines

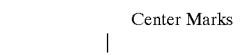

9. Look for the center of each bar

Center Marks

```
           |
-----------+---------------------------
```

10. Determine bit code from bar centers
11. Decode bit sequence and determine position in the chain code
    a)  the chain code's bit sequence is saved in memory in
        $2^{(N-4)}$ words (e.g., a 14 bit code requires
        $2^{(14-4)} = 1024$ words)
    b)  N-bit sequences are extracted from the words
    c)  each sequence is compared to the bit code to find a match
    d)  the position is the word number, times the bits in the
word (i.e., 16),
        plus the first bit position within the word, times the bit spacing
        (for the lab prototype, 0.025 inches).
    e)  after the initial match, only the words in the vicinity of the
        previous match need be checked.
12. There are a minimum of 4 marks in each 14 bits of the chain code.
The positions of the mark centers (in video lines) are related
through a linear reduction with the position of the bit centers (in
cylinder rod coordinates). The cylinder rod position relative to a central
video
position is computed from the line yielding a higher accuracy, but
relative, position. The linear reductions from sequential readings
are compared to generate a cylinder rod velocity. (Note: this action was
only accomplished off-line with the lab prototype)

What is claimed is:

1. A device for sensing the position of a movable member which moves along an axis relative to a stationary member, comprising:
    a scale including a nonrepeating code on the movable member aligned substantially along the axis;
    a two-dimensional detector fixed to the stationary member and positioned to sense a portion of the scale within a view of the detector, said detector generating a plurality of signals, each signal indicative of the particular viewed portion of the scale sensed by the detector; and
    a controller determining the position of the movable member relative to the stationary member as a function of the signals.

2. The device of claim 1 wherein the code comprises consecutive bits, where each bit is either a mark or a space, where N consecutive bits form a unique value as compared to any other N consecutive bits of the code.

3. The device of claim 2 wherein each mark has a length oriented substantially perpendicular to the axis and wherein the detector comprises an array forming L rows of elements and K columns of elements where L and K are integers and K is much greater than N, wherein each column of elements aligns substantially along the length of the marks, wherein the detector simultaneously views at least N consecutive bits of the code, and wherein each successive row or each successive column is read to generate the plurality of signals.

4. The device of claim 1 wherein the scale comprises an N-bit code where N is a sequential number of bits that form a unique value and where each bit is a mark or a space, each mark having a length oriented substantially perpendicular to the axis, and wherein the detector comprises an array forming L rows of elements aligned substantially along the length of each mark and forming K columns of elements aligned substantially along the axis of motion, the elements in each column read successively and adjacent columns being read successively to generate a plurality of signals.

5. The device of claim 4 wherein the portion of the scale being detected equals N+A bits, where A is greater than or equal to one, and wherein the portion of the scale being processed by the controller equals N bits within in the N+A bits being detected.

6. The device of claim 5 wherein two different sets of N bits within the N+A bits are processed by the controller.

7. The device of claim 4 wherein the code is a group of two repeating codes, where each repeating code has a different number of bits, where the number of bits do not have a common denominator, where when aligned with each other along the axis of motion the combination of N bits from each repeating code does not repeat for the length of the scale.

8. The device of claim 4 wherein the repeating codes are chain codes.

9. The device of claim 1 wherein the scale comprises evenly spaced bits of marks or spaces on the movable member and where the mark width is less than the bit spacing.

10. The device of claim 1 wherein the scale comprises evenly spaced marks, and wherein the length of the mark defines its bit value.

11. The device of claim 1 wherein the scale comprises unevenly spaced bits of marks or spaces on the movable member, and wherein the width of the mark or the width of the space defines the bit value.

12. The device of claim 1 wherein the scale comprises a code having N bits where each bit is a mark or a space, each mark having a length oriented substantially perpendicular to the axis, and wherein the detector comprises an array forming L rows of elements aligned substantially along the length of each mark and forming K columns of elements aligned substantially along a width of each mark, the elements in each row being read successively and adjacent rows being read successively to generate a plurality of signals.

13. The device of claim 12 wherein the portion of the scale being detected equals N+A bits, where A is greater than or equal to one, and wherein the portion of the scale being processed by the controller equals N bits within in the N+A bits being detected.

14. The device of claim 13 wherein two different sets of N marks within the N+A marks are processed by the controller.

15. The device of claim 1 wherein the scale comprises a chain code of bits represented by marks and spaces and having gaps therebetween, each mark having a width which is less than the spacing between marks and spaces.

16. The device of claim 1 wherein the detector comprises a housing supporting a substantially flat detector array for reading the scale, an optical conduit positioned between the array and the scale for transmitting an image of the scale onto the array, and an illumination source positioned to illuminate the scale.

17. The device of claim 1 wherein the detector comprises a housing supporting a substantially flat detector array for reading the scale, a lens positioned between the array and the scale for projecting an image of the scale onto the array, and an illumination source positioned to illuminate the scale.

18. The device of claim 1 wherein the code consists of a single linear code aligned substantially linearly along the axis.

19. A device for sensing the position of a cylinder rod driven along an axis relative to a linear motion cylinder, said device comprising:

a scale having a non-repeating code on the cylinder rod along the axis of motion;

a two-dimensional detector on the cylinder and positioned to sense a portion of the scale within a view of the detector which portion uniquely identifies position, said detector generating a plurality of signals, each signal indicative of the particular viewed portion of the scale sensed by the detector.

20. The device of claim 19 wherein the scale comprises a chain code having marks, each mark having a length oriented substantially perpendicular to the axis, and wherein the detector comprises an array forming L rows of elements along the length of each mark and forming K columns of elements along the axis of motion, the elements in each column being read successively and adjacent columns being read successively to generate a plurality of signals.

21. The device of claim 20 wherein the scale comprises a chain code having marks, each mark having a length oriented substantially perpendicular to the axis, and wherein the detector comprises an array forming L rows of elements along the length of each mark and forming K columns of elements along the axis of motion, the elements in each row being read successively and adjacent rows being read successively to generate a plurality of signals.

22. The device of claim 19 wherein the scale comprises a chain code having bits represented by marks and spaces having gaps therebetween.

23. The device of claim 19 wherein the detector comprises a housing supporting a substantially flat detector array for reading the scale, an optical conduit positioned between the array and the scale for transmitting an image of the scale onto the array, and an illumination source positioned to illuminate the scale.

24. The device of claim 19 wherein the detector comprises a housing supporting a substantially flat detector array for reading the scale, a lens positioned between the array and the scale for projecting an image of the scale onto the array, and an illumination source positioned to illuminate the scale.

25. The machine of claim 19 wherein the code consists of a single linear code aligned substantially linearly along the axis.

26. A machine comprising:

a base;

an extendible member supported by the base and having a movable section movable relative to a reference section;

a cylinder having a cylinder housing and having a cylinder rod movable along an axis of motion with either the cylinder housing or the cylinder rod connected to the movable section and the other of the cylinder housing or cylinder rod connected to the reference section such that movement of the cylinder rod along the axis of motion relative to the cylinder housing causes movement of the movable section relative to the reference section;

a controller controlling the position of the cylinder rod relative to the cylinder housing;

a scale having a nonrepeating code on the cylinder rod running along the axis;

a detector fixed to the cylinder housing and positioned to sense a portion of the code, said portion being sufficient to uniquely identify the position of the rod relative to the cylinder housing, said detector generating a plurality of signals, each indicative of the portion of the code; and wherein the controller determines the position of the cylinder rod relative to the cylinder housing as a function of the signals.

27. The machine of claim 26 wherein the scale comprises a chain code having bits represented by marks or spaces, each mark having a length oriented substantially perpendicular to the axis, and wherein the detector comprises an array forming L rows of elements along the length of each mark and forming K columns of elements along the axis of motion, the elements in each column being read successively and adjacent columns being read successively to generate a plurality of signals.

28. The machine of claim 26 wherein the scale comprises a chain code having bits represented by marks and spaces, each mark having a length oriented substantially perpendicular to the axis, and wherein the detector comprises an array forming L rows of elements along the length of each mark and forming K columns of elements along the axis of motion, the elements in each row being read successively and adjacent rows being read successively to generate a plurality of signals.

29. The machine of claim 26 wherein the scale comprises a chain code have marks and spaces and having gaps therebetween.

30. The machine of claim 26 wherein the detector comprises a housing supporting a substantially flat detector array for reading the scale, an optical conduit positioned between the array and the scale for transmitting an image of the scale onto the array, and an illumination source positioned to illuminate the scale.

31. The machine of claim 30 wherein the detector comprises a housing supporting a substantially flat detector array for reading the scale, a lens positioned between the array and the scale for projecting an image of the scale onto the array, and an illumination source positioned to illuminate the scale.

32. The device of claim 26 wherein the code consists of a single linear code aligned substantially linearly along the axis.

33. A device for sensing the position of a movable member which moves along an axis relative to a stationary member, comprising:

a scale including a nonrepeating code of N bits on the movable member aligned substantially along the axis;

a detector fixed to the stationary member and positioned to sense a portion of the scale, said detector having K elements where K is an integer much greater than N, each of said elements generating a signal indicative of the code of the portion of the scale sensed by the detector; and a controller determining the position of the movable member relative to the stationary member as a function of the signals.

34. A device for sensing the position of a cylinder rod driven along an axis relative to a linear motion cylinder, said device comprising:

a linear scale having a non-repeating code on the cylinder rod along the axis of motion;

a first plurality of detector elements on the cylinder and positioned to sense a portion of the scale which portion uniquely identifies position, said first plurality of detector elements generating a first signal indicative of the particular viewed portion of the scale;

a second plurality of detector elements on the cylinder and positioned to sense the portion of the scale, said second plurality of detector elements generating a second signal indicative of the particular viewed portion of the scale; and a controller determining the position of the cylinder rod relative to the linear motion cylinder as a function of the first and second signals.

35. The device of claim 34 wherein the code consists of a single linear code aligned substantially linearly along the axis.

* * * * *

UNITED STATES PATENT AND TRADEMARK OFFICE
CERTIFICATE OF CORRECTION

PATENT NO.    : 6,327,791 B1
DATED         : December 11, 2001
INVENTOR(S)   : Richard J. Norcross et al.

It is certified that error appears in the above-identified patent and that said Letters Patent is hereby corrected as shown below:

<u>Title page,</u>
Item [73], Assignee, incorrectly reads "The Government of the United States as represented by the Secretary of Commerce; National Institute of Standards and Technology" should read -- The Government of the United States of America, as represented by The Secretary of Commerce, 14th and Constitution, National Institute of Standards and Technology, Washington, D.C.; Snorkel International, Inc. of St. Louis, Missouri --.

Signed and Sealed this

Twenty-seventh Day of May, 2003

JAMES E. ROGAN
*Director of the United States Patent and Trademark Office*